United States Patent
Liaghati

(10) Patent No.: US 9,608,665 B2
(45) Date of Patent: *Mar. 28, 2017

(54) ADAPTIVE COMPRESSION OF DATA

(71) Applicant: The BOEING COMPANY, Chicago, IL (US)

(72) Inventor: Amir L. Liaghati, Huntsville, AL (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/961,780

(22) Filed: Dec. 7, 2015

(65) Prior Publication Data

US 2016/0226514 A1    Aug. 4, 2016

Related U.S. Application Data

(63) Continuation-in-part of application No. 14/609,007, filed on Jan. 29, 2015, now Pat. No. 9,425,819.

(51) Int. Cl.
  H03M 7/34   (2006.01)
  H03M 7/30   (2006.01)
  H03M 7/42   (2006.01)

(52) U.S. Cl.
  CPC ....... *H03M 7/3055* (2013.01); *H03M 7/3046* (2013.01); *H03M 7/42* (2013.01)

(58) Field of Classification Search
  CPC ....... H03M 7/30; H03M 7/3088; H04L 29/06; H04L 63/04; H04L 63/0428; H04L 63/1441; H04N 19/169; H04N 19/12; H04N 19/156; H04N 19/132; G06F 17/30144; G06F 17/30153; G06F 17/30233
  USPC ....... 341/50–91; 709/247; 370/465; 707/692
  See application file for complete search history.

(56) References Cited

U.S. PATENT DOCUMENTS

| | | | |
|---|---|---|---|
| 2,112,384 A | 3/1938 | Sloan et al. | |
| 5,701,302 A * | 12/1997 | Geiger | H03M 7/30 341/106 |
| 8,805,149 B2 * | 8/2014 | Takemura | G02F 1/035 385/129 |
| 2002/0103938 A1 * | 8/2002 | Brooks | H03M 7/30 709/247 |
| 2004/0255215 A1 * | 12/2004 | Hildebrant | G01R 31/318335 714/742 |
| 2005/0024236 A1 * | 2/2005 | Gosdin | G08G 5/0013 340/905 |

(Continued)

OTHER PUBLICATIONS

Mansour et al., "Simulation of DPCM and ADM Systems," Computer Modelling and Simulation (UKSim), 2012 UKSim 14th International Conference on; pp. 416,421, Mar. 28-30, 2012; (6 pgs).

(Continued)

*Primary Examiner* — Lam T Mai
(74) *Attorney, Agent, or Firm* — Toler Law Group, PC

(57) ABSTRACT

A method of encoding data includes determining a magnitude of change between a first value associated with first data and a second value associated with second data based on a comparison of the first value and the second value. The first value is encoded into a first set of bits having a first number of bits. The method also includes encoding the magnitude of change into a second set of bits utilizing a sign-interspersed two's complement encoding scheme. The second set of bits has a second number of bits that is less than the first number of bits.

20 Claims, 6 Drawing Sheets

(56) References Cited

U.S. PATENT DOCUMENTS

| | | | | |
|---|---|---|---|---|
| 2007/0096954 A1* | 5/2007 | Boldt | ............ | H03M 7/30 |
| | | | | 341/50 |
| 2010/0228703 A1* | 9/2010 | Schneider | ............ | H03M 7/30 |
| | | | | 707/693 |
| 2013/0230947 A1* | 9/2013 | Hsu | ............ | H01L 21/561 |
| | | | | 438/126 |
| 2014/0188819 A1* | 7/2014 | Bagal | ............ | G06F 17/30144 |
| | | | | 707/692 |
| 2015/0110131 A1* | 4/2015 | Roskind | ............ | H04L 63/0428 |
| | | | | 370/465 |

OTHER PUBLICATIONS

Simkus et al., "Ultra-low delay lossy audio coding using DPCM and block companded quantization," Communications Theory Workshop (AusCTW); 2013 Australian, pp. 43,46, Jan. 29-Feb. 1, 2013; (4 pgs).

* cited by examiner

ADAPTIVE COMPRESSION OF DATA

CROSS-REFERENCE TO RELATED APPLICATIONS

The present application is a continuation-in-part of, and claims priority to pending U.S. patent application Ser. No. 14/609,007, entitled "ADAPTIVE COMPRESSION OF DATA," the contents of which are incorporated herein by reference their entirety.

FIELD

The present disclosure generally relates to adaptive compression of data.

BACKGROUND

Differential Pulse Code Modulation (DPCM) is an example of an approach to data compression. In a DPCM approach, rather than quantizing each data sample into a "full" number of bits, a difference between consecutive data samples may be quantized into a reduced number of bits (for transmission or storage).

SUMMARY

In an embodiment, a method of encoding data is disclosed. The method includes determining a magnitude of change between a first value associated with first data and a second value associated with second data based on a comparison of the first value and the second value. The first value is encoded into a first set of bits having a first number of bits. The method also includes encoding the magnitude of change into a second set of bits utilizing a sign-interspersed two's complement encoding scheme. The second set of bits has a second number of bits that is less than the first number of bits.

In another embodiment, a method of decoding data is disclosed. The method includes receiving a first set of bits having a first number of bits and utilizing a sign-interspersed two's complement decoding scheme to decode the first set of bits. The method includes determining that the first set of bits corresponds to a first indicator. The first indicator indicates that a second number of bits are to be decoded, where the second number of bits is different from the first number of bits. The method also includes receiving a second set of bits having the second number of bits and decoding the second set of bits to determine a magnitude of change between a first value associated with first data and a second value associated with second data.

In another embodiment, a system includes a processor and a memory that is communicatively coupled to the processor. The memory stores instructions that are executable by the processor to perform various operations. The operations may include determining a magnitude of change between a first value associated with first data and a second value associated with second data based on a comparison of the first value and the second value. The first value is encoded into a first set of bits having a first number of bits. The operations may also include encoding the magnitude of change into a second set of bits utilizing a sign-interspersed two's complement encoding scheme. The second set of bits has a second number of bits that is less than the first number of bits.

The described features, functions, and advantages may be achieved independently in various embodiments or may be combined in yet other embodiments further details of which can be seen with reference to the following description and drawings.

DETAILED DESCRIPTION

Figure 1:
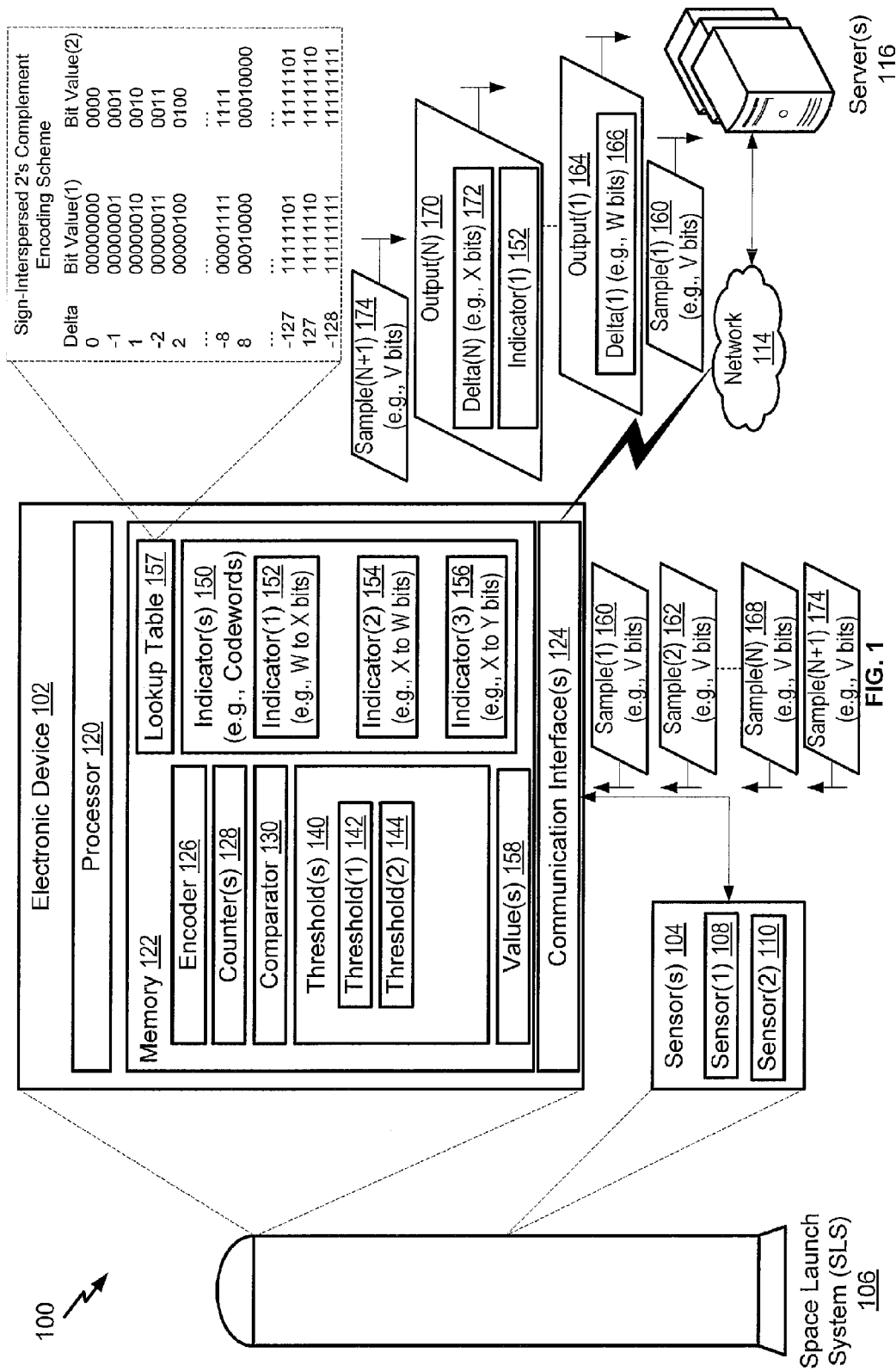
FIG. 1 is a block diagram of a particular embodiment of an adaptive data encoding system.

The present disclosure describes systems and methods of adaptive encoding/decoding of data in order to reduce a number of bits to be used for transmission and/or storage of the data. For example, a sensor may measure (sample) a particular parameter (e.g., temperature or pressure) at a particular sampling rate, and measured values (e.g., analog value, such as voltages) may be encoded (e.g., digitized) into a set of bits. In the present disclosure, a reference value (e.g., a value used as a reference for compression of data) may be encoded into a "full" number of bits and stored (and optionally transmitted). As an illustrative, non-limiting example, the reference value may be encoded into 12 bits (e.g., the "full" number of bits). In other examples, the "full" number of bits may be more than 12 bits or fewer than 12 bits. Rather than encoding each subsequent measured value into the "full" number of bits, a measured value (at the "full" number of bits) of a subsequent data sample is compared to the reference value in order to determine a magnitude of change (a "delta") between the measured value and the reference value. The magnitude of change is encoded into a number of bits that is less than the "full" number of bits.

This process of encoding the magnitude of change into a reduced number of bits may be repeated for a particular number (N) of values that follow the reference value. Each of the N values is compared to the reference value to determine the magnitude of change between a particular measured value and the reference value. Comparing a measured value (at the "full" number of bits) to the reference value rather than comparing "delta" values may reduce drift due to errors in each "delta" value. After N values, a next measured value (N+1) is encoded as a "new" reference value (as a reference for compression of subsequent data).

To illustrate, when the reference value has 12 bits, the magnitude of change between a measured value and the reference value may be encoded into a reduced number of bits. As an example, a "default" reduced number of bits may be 4 bits. In other examples, the "default" reduced number of bits may be more than 4 bits or fewer than 4 bits. A particular number of bits may be selected as the "default" reduced number of bits such that most expected values can be encoded, using the encoding scheme, within the "default" number of bits. In some cases, the magnitude of change between the measured value and the reference value may be encoded as a 4-bit binary value (the "default" reduced number of bits). In other cases, the magnitude of change may be outside of a range of "delta" values that can be encoded into 4 bits. While the change may be encoded into a different reduced number of bits (e.g., 8 or 10 bits), a detector/decoder may be "expecting" 4 bits (based on an encoding/decoding protocol). In the present disclosure, a particular indicator (or "codeword") that is encoded into the "default" number of bits (e.g., 4 bits) may be pre-assigned to a particular "non-default" reduced number of bits (e.g., 8 or 10 bits). The particular indicator provides a signal to the detector/decoder that a particular "delta" that follows the indicator is encoded into the "non-default" reduced number of bits. The "non-default" reduced number of bits may be decoded in order to identify the particular "delta" that follows the indicator. The examples provided herein describe different "non-default" reduced numbers of bits that are greater than the "default" reduced number of bits (e.g., 8 or 10 bits compared to the "default" reduced number of 4 bits). In alternative embodiments (e.g., in cases of relatively "small" changes that can be encoded into fewer than the "default" reduced number of bits), the "default" reduced number of bits may be further reduced (e.g., to 3 bits or to 2 bits, etc.).

In order to reduce a number of bits, it is advantageous to be able to represent the most common delta values (e.g., small magnitude delta values) in a low-bit format (e.g., in a 4-bit format) and to represent less common delta values (e.g., large magnitude delta values) in a high-bit format (e.g., in an 8-bit format). In conventional two's complement schemes, 8-bit positive integers are used to represent values from 0 to 255. However, in DPCM, as delta values are calculated, the delta values can have both positive and negative values. Thus, 8 bits may be used to represent values from −128 to 127. As an example, a conventional two's complement encoding scheme may represent a small positive delta value using a small binary value. For example, a +1 delta value may be represented using a small binary value of 00000001. Also, the conventional two's complement encoding scheme may represent a small negative delta value using a large binary value. For example, a −1 delta value may be represented using a large binary value of 11111111. Thus, using the conventional two's complement encoding scheme, in the case of a small binary value (e.g., 00000001) representing a positive integer, the four most significant bits are zeros, allowing the 8 bits to be reduced to 4 bits via omission of the four most significant bits. By contrast, using the conventional two's complement encoding scheme, in the case of a large binary value (e.g., 11111111) representing a negative integer, the four most significant bits are ones. Thus, using the conventional two's complement encoding scheme, the four most significant bits may be used to differentiate between positive and negative integers, preventing the 8 bits from being reduced to 4 bits.

In the present disclosure, a modified two's complement encoding scheme (referred to herein as a "sign-interspersed two's complement encoding scheme") is disclosed. The sign-interspersed two's complement encoding scheme of the present disclosure may be utilized in order to allow the most common positive and negative delta values (e.g., small delta values closest to a delta of zero) to be represented using 4 bits rather than 8 bits.

In the sign-interspersed two's complement encoding scheme of the present disclosure, binary numbers may be re-mapped (e.g., using a lookup table) such that delta values from −8 to 7 have binary values from 0 to 15 (which may be represented using 4 bits by omitting the four most significant bits of an 8-bit binary representation). The re-mapping includes alternating the delta values from negative delta values to positive delta values as the binary representations increase. For example, a delta value of −1 may be assigned a binary value equal to 1, which is 00000001 binary. As another example, a delta value of +1 may be assigned a binary value equal to 2, which is 00000010 binary. As a further example, binary value 3 (00000011 binary) may be assigned to delta value of −2, and so on. To reduce a number of bits that are stored and/or sent, one or more of the most significant bits (e.g., 4 zeros in this example) may be omitted, allowing common delta values in a range of −8 to +7 to be encoded into 4 bits rather than 8 bits.

As described further herein, one or more of the re-mapped bit values may be reserved as indicators ("codewords") for providing a signal of a transition in the event that a less common delta value is to be decoded. To illustrate, delta values of −7 to +7 may be represented in 4 bits, and the four bit representation of −8 in the sign-interspersed two's complement encoding scheme (e.g., 1111) may be used to signal a transition to a higher bit encoding scheme for delta values in a range of −9 to −128 and for delta values in a range of +8 to +127 (with one or more of the delta values, such as −128, −127, +127 reserved as codewords). After receiving the codeword −8 (1111 binary), the decoder knows that a next value to be decoded is a non-default 8 bit binary value. In the event that a particular delta value that is reserved as a codeword (e.g., a delta value of −8 in this case), the particular delta value may be encoded in a higher bit format. To illustrate, when the delta value is −8, the four bit representation of −8 (e.g., 1111) may be used to signal a transition to an 8 bit encoding scheme, followed by an 8 bit representation of the −8 delta value (e.g., an 8-bit representation of −127 in the sign-interspersed two-complement encoding scheme). As another example, in the sign-interspersed two's complement encoding scheme, another indicator may be used to signal a transition from the non-default 8 bit binary value to the default 4 bit binary value. To illustrate, an eight bit representation of −128 in the sign-interspersed two's complement encoding scheme (e.g., 11111111) may be used to signal a transition to the lower bit default encoding scheme. The decoder, after receiving the codeword −128 (11111111 binary), knows that a next value to be decoded is a default 4 bit binary value. Alternatively, as described further herein, the decoder may determine that an 8-bit binary value in which the four most significant bits are zeros (e.g., 00000100) simultaneously signals a transition and includes the delta value (e.g., 0100, following 0000 in the 8-bit binary value). As a further example, an eight bit representation of 127 in the sign-interspersed two's complement encoding scheme (e.g., 11111110) may be reserved as a third indicator to signal a transition from the first non-default encoding scheme (e.g., using 8 bits) to a second non-default encoding scheme (e.g., using 10 bits). The decoder, after receiving the codeword 127 (11111110 binary), knows that a next value to be decoded is a non-default 10 bit binary value.

In an illustrative, non-limiting example of an encoding scheme, a difference between a measured temperature value and a reference temperature value may be reduced to a particular 4-bit binary value that corresponds to a temperature change in a range of −7 degrees to +7 degrees. When the temperature change between the measured value and the reference value is within this range (i.e., not greater than +7 and not less than −7), the temperature change may be encoded as a 4-bit binary value (the "default" reduced number of bits) using the sign-interspersed two's complement encoding scheme of the present disclosure. In other cases, the temperature change may be outside of this range (i.e., greater than +7 or less than −7), and the change cannot be stored as a 4-bit binary value. While the change may be encoded into a different reduced number of bits (e.g., 8 or 10 bits), a detector/decoder may be expecting a 4-bit binary value using this encoding scheme. In the present disclosure, an indicator (or "codeword") may be sent prior to sending the data in the different reduced number of bits to provide a signal to the decoder that a different binary value (e.g., an 8 bit delta value or a 10 bit delta value) follows the indicator.

To illustrate, using the sign-interspersed two's complement encoding of the present disclosure, an encoder may encode delta values in a range of −7 to 7 as 4-bit values. In this example, a 4-bit value corresponding to a delta value of −8 may be reserved as a codeword. To illustrate, in the sign-interspersed 2's complement encoding scheme of the present disclosure, the value −8 may be represented by the 4-bit binary value 1111. In this example, one codeword (e.g., 1111) may be reserved for use as a first indicator of a first "non-default" reduced number of bits (e.g., 8 bits). Thus, data that is stored/transmitted may be reduced in cases where the delta values fall within a "default" range, while the codeword may allow values outside of this range to be stored/transmitted when appropriate.

As another example, using the sign-interspersed two's complement encoding scheme of the present disclosure, the encoder may encode delta values in ranges of −9 to −126 and +8 to +126 as 8-bit values. In this example, the 8-bit values corresponding to the delta values of −128, −127, and +127 may be reserved as codewords. To illustrate, the value −128 may be represented by the 8-bit binary value 11111111, the value −127 may be represented by the 8-bit binary value 11111101, and the value 127 may be represented by the 8-bit binary value 11111110. In this example, one codeword (e.g., 11111111) may be reserved for use as a second indicator of a transition from a first "non-default" reduced number of bits (e.g., 8 bits) to the "default" reduced number of bits (e.g., 4 bits), and another codeword (e.g., 11111110) may be reserved for use as a third indicator of a transition from the first "non-default" reduced number of bits (e.g., 8 bits) to a third "non-default" reduced number of bits (e.g., 10 bits). Thus, data that is stored/transmitted may be reduced in cases where the delta values fall within a "default" range, while the codewords may allow values outside of this range to be stored/transmitted when appropriate. Further, as previously described herein, the 8-bit binary value 11111101 may be reserved as an 8-bit representation of a delta value of −8.

Referring to FIG. 1, a particular embodiment of an adaptive encoding system is illustrated and generally designated 100. FIG. 1 illustrates that a value (e.g., an analog value, such as a voltage) received from a sensor may be encoded (e.g., digitized) into a particular number of bits in order to reduce an amount of data that is stored, transmitted, or both. In FIG. 1, a reference value (corresponding to a particular data sample) may be encoded into a first number of bits (a "full" number of bits, such as 12 bits) and sent to memory and/or transmitted. Subsequent measured values (e.g., N values) may be compared to the reference value in order to determine a magnitude of change (a "delta"). The magnitude of change may be encoded into a reduced number of bits. In cases where the magnitude of change is outside of a range of values that may be encoded into a "default" reduced number of bits (e.g., 4 bits), an indicator (also referred to herein as a "codeword") may be used to signal a detector/decoder that the magnitude of change is encoded into a "non-default" reduced number of bits (e.g., 8 or 10 bits). Similarly, another indicator may be reserved for signaling a transition from an 8-bit encoding scheme to the default 4-bit encoding scheme, and another indicator may be reserved for signaling a transition from the 8-bit encoding scheme to the 10-bit encoding scheme. In some cases, when the 8-bit encoding scheme is being used, an 8-bit representation of the indicator that signaled a transition from the 4-bit encoding scheme to the 8-bit encoding scheme (e.g., 00001111 in 8 bits, corresponding to the addition of four leading zeros to the 4-bit indicator of 1111) may also signal a return from the 8-bit encoding scheme to the 4-bit encoding scheme. Alternatively, the addition of four leading zeros to a 4-bit value (e.g., 0100 for a delta value of +2) may serve as an indication of the transition from the 8-bit encoding scheme to the 4-bit encoding scheme. To illustrate, for a delta value of +2, the encoder may send the 8-bit binary value of 00000100, which simultaneously serves as an indication of the transition to the 4-bit encoding scheme while also providing the delta value (e.g., the delta value of +2, encoded as 0100 following the four leading zeros).

In the embodiment illustrated in FIG. 1, an electronic device 102 is configured to receive data from one or more sensors 104 of a space launch system 106. In other cases, the sensor(s) 104 may be associated with another system (e.g., a refinery, a manufacturing facility, an aircraft, or a satellite, among other alternatives). In the example of FIG. 1, the one or more sensors 104 include a first sensor 108 (e.g., a temperature sensor) and a second sensor 110 (e.g., a pressure sensor). In other cases, the electronic device 102 may be configured to receive data from more than two sensors, fewer than two sensors, different sensors, or different types of sensors. In the example of FIG. 1, the electronic device 102 is configured to communicate via a network 114 (or multiple networks) to a server 116 (or multiple servers). For example, the server 116 may be a terrestrial system configured to communicate with the space launch system 106 (e.g., before, during, or after launch).

The electronic device 102 includes a processor 120, a memory 122, and a communication interface 124 (or multiple communication interfaces). In the example of FIG. 1, an encoder 126, a counter 128 (or multiple counters), a comparator 130, and one or more thresholds 140 are stored in the memory 122. FIG. 1 illustrates an example in which the threshold(s) 140 include a first threshold 142, a second threshold 144, and a third threshold 146. In alternative embodiments, an alternative number of threshold(s) may be stored in the memory 122. Further, FIG. 1 illustrates that one or more indicators 150 (e.g., "codewords") are stored in the memory 150. In the example of FIG. 1, the indicator(s) 150 include a first indicator 152, a second indicator 154, and a third indicator 156. In alternative embodiments, an alternative number of indicator(s) 150 may be stored in the memory 122. Each of the indicator(s) 150 may be associated with a particular threshold. To illustrate, the first indicator 152 may be associated with the first threshold 142, the second indicator 154 may be associated with the second threshold 144, and the third indicator 156 may be associated with the third threshold 146.

FIG. 1 further illustrates an example of a lookup table 157 associated with the sign-interspersed two's complement encoding scheme of the present disclosure that is stored in the memory 122. Alternatively, the electronic device 102 may be configured to calculate one or more values of the lookup table 157 based on an algorithm corresponding to the sign-interspersed two's complement encoding scheme of the present disclosure (e.g., using hardware, software, or a combination thereof). The lookup table 157 includes a first plurality of bit values having the second number of bits (4 bits in this case) and a second plurality of bit values having a third number of bits (8 bits in this case). A bit reduction from the third number of bits (8 bits) to the second number of bits (4 bits) is associated with omission of one or more most significant bits, as shown by the removal of the four most significant bits of Bit Value(1) to Bit Value(2) for sign-interspersed delta values from 0 to −8 (where 1111 serves as an indicator, as described further herein). In the present disclosure, utilizing the sign-interspersed two's complement encoding scheme may include encoding a first positive magnitude of change (e.g., +1) as a first two's complement value (0010 binary). Utilizing the sign-interspersed two's complement encoding scheme may include encoding a second positive magnitude of change (e.g., +2) as a first two's complement value (0100 binary). Utilizing the sign-interspersed two's complement encoding scheme may include encoding a first negative magnitude of change (e.g., −1) as a third two's complement value (0001 binary). Utilizing the sign-interspersed two's complement encoding scheme may include encoding a second negative magnitude of change (e.g., −2) as a fourth two's complement value (0011 binary).

The example lookup table 157 of FIG. 1 illustrates that, when ordered from a smallest two's complement value (00000000 in 8 bits, without omitting the four most significant bits) to a largest two's complement value (11111111 in 8 bits), the first two's complement value (0010 in 4 bits) is between the third two's complement value (0011 in 4 bits) and the fourth two's complement value (0011 in 4 bits). In addition, the fourth two's complement value (0011 in 4 bits) is between the first two's complement value (0010 in 4 bits) and the second two's complement value (0100 in 4 bits). For ease of illustration, the lookup table 157 of FIG. 1 depicts a subset of possible delta values and a subset of associated bit values, it will be appreciated that the lookup table 157 also includes other possible delta values and associated bit values. To illustrate, other delta values that may be encoded in the "default" reduced number of bits (4 bits) include −3 (0101); 3 (0110); −4 (0111); 4 (1000); −5 (1001); 5 (1010); −6 (1011); 6 (1100); −7 (1101); and 7 (1110). Similarly, the lookup table 157 also includes other delta values (in a range of −128 to 127, with −128 and 127 reserved as indicators) that may be encoded in the first "non-default" number of bits (8 bits).

The electronic device 102 is configured to receive or sample measured values from the sensor(s) 104 (e.g., via the communication interface 124) at a particular sampling rate. As an illustrative example, the electronic device 102 may receive or sample a value (e.g., a voltage measured by a thermocouple in the case of a temperature sensor) from the first sensor 108 and may receive or sample another value (e.g., a value corresponding to a pressure measurement) from the second sensor 110. The encoder 126 is configured to encode data into a set of bits (having a particular number of bits that may vary based on a sampling rate of the sensor). In some cases, the encoded value may be stored in the memory 122 of the electronic device 102 (e.g., onboard the space launch system 106). Alternatively or additionally, the encoded value may be sent to the server 116 (e.g., a ground-based server configured to communicate with the space launch system 106).

In the particular embodiment illustrated in FIG. 1, the encoder 126 is configured to determine, based on the counter 128, whether to encode the data as a reference value (e.g., using a "full" number of bits). In the event that a measured value is not to be used as a reference value, a comparator 130 is configured to compare the measured value (e.g., a 12 bit value) to a reference value 158 (e.g., a 12 bit value) that is stored in the memory 122. Based on a result of the comparison, the comparator 130 is configured to determine a magnitude (and direction) of change between the measured value and the reference value 158. The comparator 130 is further configured to determine whether the magnitude of change is to be encoded into a first number of bits (e.g., W bits in FIG. 1, representing a "default" reduced number of bits, such as 4 bits) or is to be encoded into a different reduced number of bits (e.g., X or Y bits in FIG. 1, such as 8 or 10 bits). The encoder 126 is configured to encode the magnitude of change into the reduced number of bits (as a "delta") and to provide the reduced number of bits as an output.

When the magnitude of change is to be encoded into a number of bits other than the "default" number of bits (e.g., a "non-default" reduced number of bits), the comparator 130 is configured to determine a particular indicator ("codeword") to be used by the encoder 126 to provide a signal to a detector/decoder that the magnitude of change is not encoded into the "default" number of bits. In the particular embodiment illustrated in FIG. 1, when the comparator 130 determines that the magnitude of change satisfies the first threshold 142 (e.g., associated with X-bit values), the encoder 126 is configured to use the first indicator 152. To illustrate, the first indicator 152 may be used to identify that the magnitude of change corresponds to an 8-bit value (e.g., a change that cannot be represented, based on the encoding scheme, using 4 bits). When using the 8-bit values for encoding, if a sample value is received that can be encoded using 4 bits (e.g., less than the first threshold 142), the encoder 126 may be configured to use the second indicator 154. To illustrate, the second indicator 154 may be used to identify a transition from an 8 bit non-default encoding scheme to a 4 bit default encoding scheme. Alternatively, the encoder 126 may add four leading zeros to a 4-bit representation of the delta value (e.g., adding 0000 to 0100 in the case of a delta value of +2 to generate the 8-bit binary value of 00000100), which may simultaneously indicate the transition to the 4-bit encoding scheme as well as providing the delta value. When the comparator 130 determines that the magnitude of change satisfies the second threshold 144 (e.g., associated with Y-bit values), the encoder 126 is configured to use the third indicator 156. To illustrate, the third indicator 156 may be used to identify that the magnitude of change corresponds to a 10-bit value (e.g., a change that cannot be represented, based on the encoding scheme, using 8 bits or 9 bits). As such, the third indicator 156 may signal a transition from the 8-bit non-default encoding scheme to a 10-bit non-default encoding scheme. While not shown in the example of FIG. 1, when using the 10-bit values for encoding, if a sample value is received that can be encoded using 8 bits (e.g., less than the second threshold 144), the encoder 126 may be configured to use a fourth indicator (in a 10-bit format). To illustrate, the fourth indicator may be used to identify a transition from the 10-bit non-default encoding scheme to the 8-bit non-default encoding scheme (e.g., via the addition of two leading zeros to an 8-bit binary value) or to the 4-bit default encoding scheme (e.g., via the addition of six leading zeros to a 4-bit binary value).

In operation, a particular sensor (e.g., the first sensor 108) provides a first sample 160 (identified as "Sample(1)" in FIG. 1) to the electronic device 102. For example, the first sample 160 may be a first voltage corresponding to a first sampled temperature, a first sampled pressure, or another sampled parameter. The first sample 160 may be digitized as a particular number of bits (e.g., V bits in FIG. 1, representing a "full" number of bits used for a reference value). In the example of FIG. 1, the encoder 126 determines, based on the counter 128, that the first sample 160 is to be encoded into V bits and sent to the memory 122 for storage as the reference value 158 for comparison to a particular number (N) of subsequent sampled value(s). For example, the counter 128 may be incremented following storage of the first sample 160 as the reference value 158 in order to determine when a "new" reference value is to be encoded at the "full" number of bits. FIG. 1 further illustrates a particular embodiment in which the first sample 160 is transmitted to the server 116 (e.g., a ground-based server).

After providing the first sample 160, the first sensor 108 provides a second sample 162 (identified as "Sample(2)" in FIG. 1) to the electronic device 102. Alternatively, sensor output is continuous, and the first sensor 108 samples and digitizes the second sample 162 at a second time. For example, the second sample 162 may be a second voltage corresponding to a second sampled temperature. The encoder 126 determines (based on the counter 128) that the second sample 162 is not to be stored as a reference value. Instead, the second sample 162 is to be compared to the reference value 158 stored in the memory 122 (e.g., the first sample 160) in order to determine a magnitude of change to be encoded into a particular reduced number of bits. For example, the counter 128 may be "reset" (e.g., to a value of zero or one) following the storage of the first sample 160 as the reference value 158, and N (e.g., 10, 20, 30, 50, etc.) samples following the first sample 160 (including the second sample 162) may be encoded into a reduced number of bits.

In the particular embodiment illustrated in FIG. 1, the comparator 130 determines that a magnitude of change between the reference value 158 and the second sample 162 does not satisfy the first threshold 142 and is to be encoded into a "default" number of bits (e.g., W bits, such as 4 bits). In this case, the encoder 126 encodes the magnitude of change into the "default" number of bits (e.g., using the sign-interspersed two's complement encoding scheme) and generates a first output 164 (identified as "Output(1)" in FIG. 1) that includes a first change 166 (identified as "Delta(1)" in FIG. 1). FIG. 1 further illustrates that the first output 164 may be transmitted to the server 116. Alternatively or additionally, the first output 164 may be sent to the memory 122 for storage.

As an illustrative, non-limiting example, the magnitude of change between the reference value 158 and the second sample 162 may correspond to a temperature change, and the "default" reduced number of bits (W bits) may be 4 bits. When 4 bits are used, 16 digital values may be represented (e.g., 0-15). In this example, a temperature range may be divided into sub-ranges, each associated with a different digital value. Since temperature may vary up or down, the 16 sub-ranges may be shifted to +7 sub-ranges and −7 sub-ranges so that a direction of the temperature change can be represented (with −8 reserved as a codeword, as described further herein). For example, when each sub-range is associated with 1° C., 4 bits may be used to represent changes from −7° C. to +7° C. In this example, when the temperature change is outside of this range (e.g., is greater than +7 degrees or is less than −8 degrees), the change cannot be represented by 4 bits. While the change may be encoded into a different number of bits (e.g., 8 or 10 bits), a detector/decoder may be expecting a 4-bit value. In this case, one of the indicator(s) 150 (or "codewords") may be sent prior to sending the data in the different number of bits to provide a signal to the decoder that a different binary value (e.g., an 8 bit delta value or a 10 bit delta value) follows the indicator.

After providing the second sample 160, FIG. 1 illustrates that the first sensor 108 provides additional subsequent samples. For example, the first sensor 108 may provide a sample 168 (identified as "Sample(N)" in FIG. 1) to the electronic device 102. FIG. 1 further illustrates that one or more intervening samples may optionally be provided before the sample 168. For example, the sample 168 may be a voltage corresponding to a temperature that is sampled after the second sample 162 (and potentially after the one or more intervening samples). The encoder 126 determines (based on the counter 128) that the sample 168 is not to be stored as a reference value. Instead, the sample 168 is to be compared to the reference value 158 stored in the memory 122 (e.g., the first sample 160) in order to determine a magnitude of change that is to be encoded into a reduced number of bits. The comparator 130 compares the reference value 158 stored in the memory 122 (e.g., the first sample 160) to determine the magnitude of change between the reference value 158 and a value of the sample 168.

In the particular embodiment illustrated in FIG. 1, the comparator 130 determines that the magnitude of change between the first sample 160 and the sample 168 satisfies the first threshold 142. Thus, the magnitude of change cannot be represented using the "default" number of bits (e.g., W bits in the example of FIG. 1). Accordingly, the magnitude of change may be encoded into a second ("non-default") number of bits (e.g., X bits in the example of FIG. 1). Further, the comparator 130 identifies the first indicator 152 as an indicator to be provided by the encoder 126. The indicator 152 indicates that the sample 168 is encoded into the second number of bits. In this case, the encoder 126 encodes the magnitude of change into the second number of bits and generates an output 170 (identified as "Output(N)" in FIG. 1) that includes the first indicator 152 and a change 172 (identified as "Delta(N)" in FIG. 1). FIG. 1 further illustrates that the output 170 may be transmitted to the server 116. Alternatively or additionally, the output 170 may be sent to the memory 122 for storage.

To illustrate, in a particular encoding scheme, the comparator 130 may be used to provide 4-bit binary values representing changes (e.g., temperature changes) between −7 and +7 to the encoder 126. Thus, if the particular encoding scheme is such that each digital value corresponds to 1° C., the first range may represent temperature changes between −7° C. and +7° C., etc. In this example, the comparator 130 reserves the value −8 for use as a first codeword, the value −128 for use as a second codeword, and the value 127 for use as a third codeword. Further, as previously described herein, the value −127 (11111101 binary) may be reserved for cases where −8 is the delta value. To illustrate, in the sign-interspersed 2's complement scheme, the value −8 may be represented by the 4-bit binary value 1111, the value −128 may be represented by the 8-bit binary value 11111111, and the value 127 may be represented by the 8-bit binary value 11111110. As an illustrative, non-limiting example, the first indicator 152 (e.g., 1111) may be used to identify that a magnitude of change (e.g., a temperature change having a value in a range from +8 to +126 or in a range from −9 to −126) corresponds to an 8-bit value that cannot be represented, based on the encoding scheme, using 4 bits. The second indicator 154 (e.g., 11111111) may be used to signal a transition from an 8 bit encoding scheme to a 4 bit encoding scheme. The third indicator 156 (e.g., 11111110) may be used to identify that a magnitude of change (e.g., a temperature change having an absolute value from 256 to 512) corresponds to a 10-bit value that cannot be represented, based on the encoding scheme using 8 bits.

FIG. 1 illustrates a particular example in which the comparator 130 determines that the magnitude of change between the first sample 160 and the sample 168 satisfies the first threshold 142. In other cases, the comparator 130 may determine that the magnitude of change satisfies the second threshold 144 and is to be encoded into a third ("non-default") number of bits (e.g., Y bits in the example of FIG. 1). In this case, the encoder 126 may encode the magnitude of change into the third number of bits, and the output 170 may include the second indicator 154 and the change 172.

FIG. 1 further illustrates that the first sensor 108 provides another sample 174 (identified as "Sample(N+1)" in FIG. 1) to the electronic device 102. For example, the sample 174 may be a voltage corresponding to a next temperature that is sampled after the sample 168. The encoder 126 determines, based on the counter 128, that the sample 174 is to be used as a "new" reference value for comparison to subsequent sampled values (not shown in FIG. 1). Accordingly, the sample 174 may be encoded into V bits (e.g., 12 bits) and stored in the memory 122. FIG. 1 further illustrates a particular embodiment in which the sample 174 is transmitted to the server 116 (e.g., a ground-based server).

Thus, FIG. 1 illustrates that an amount of data that is stored/transmitted may be reduced by selectively encoding changes ("deltas") between a reference value and subsequent values into a reduced number of bits. Comparing a measured value (at the "full" number of bits) to the reference value rather than comparing consecutive "delta" values (having a reduced number of bits) may reduce drift resulting from an error that occurs in one "delta" value propagating until a reference value is sampled. Further, in cases where the "delta" value is outside of a range of values that may be encoded into a "default" number of reduced bits (e.g., 4 bits), an indicator (also referred to herein as a "codeword") may be used to signal a detector/decoder that the particular value is encoded into a "non-default" number of bits (e.g., 8 or 10 bits).

Figure 2:
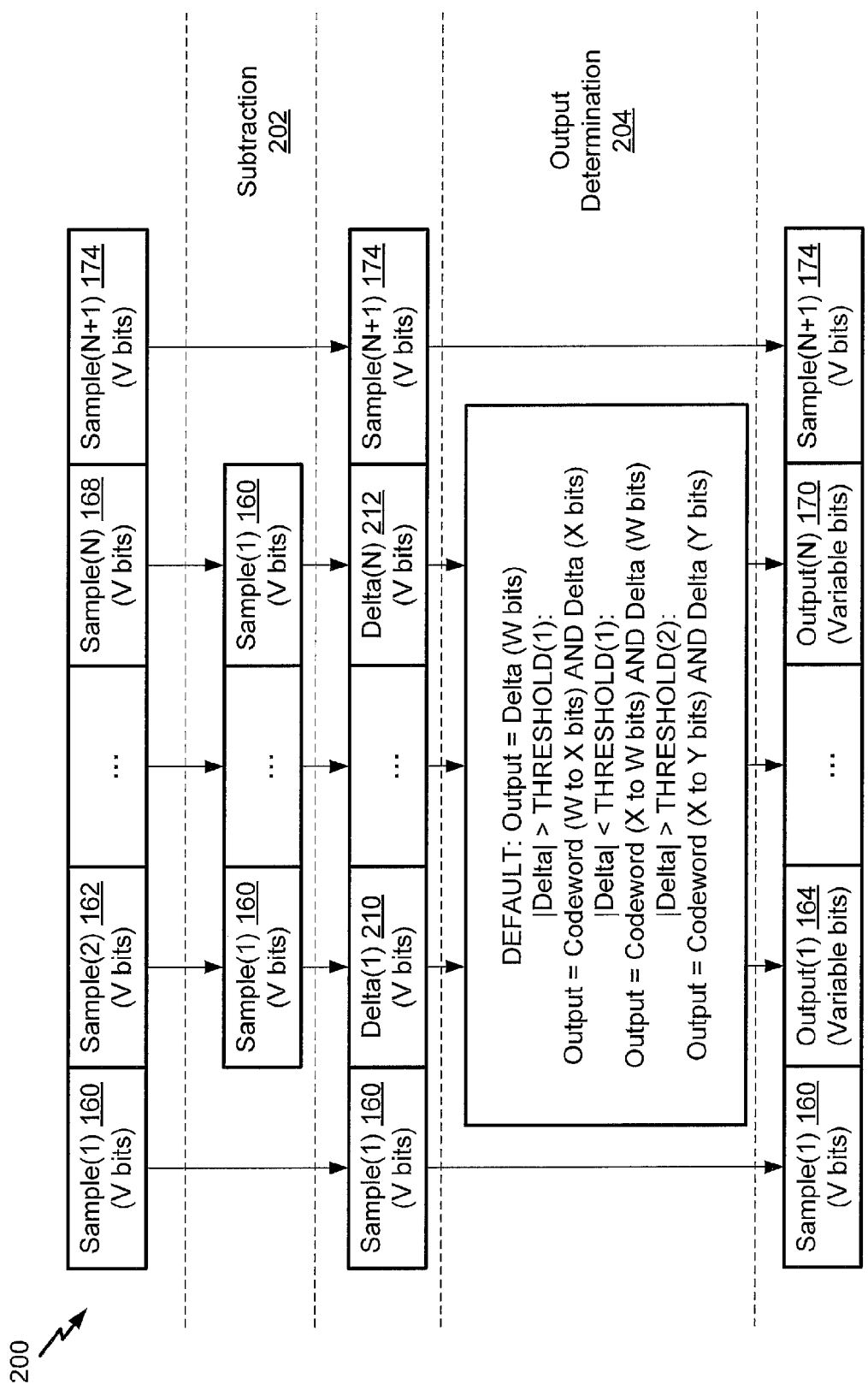
FIG. 2 is a diagram depicting a particular example of adaptively encoding data.

FIG. 2 is a diagram 200 depicting a particular example of adaptively encoding data. FIG. 2 illustrates that a reference value may be stored, and subsequent measured values may be compared to the reference value in order to determine a magnitude of change (a "delta") between the particular measured value and the reference value. The magnitude of change may be encoded into a number of bits that is less than a "full" number of bits. For example, the "full" number of bits may be 12 bits. In other examples, the "full" number of bits may be more than 12 bits or fewer than 12 bits. This process of encoding the magnitude of change into a reduced number of bits may be repeated for a particular number (N) of values that follow the reference value. Comparing a measured value (at the "full" number of bits) to the reference value rather than comparing "delta" values may reduce drift resulting from an error that occurs in one "delta" value propagating until a next reference value is sampled. FIG. 2 further illustrates that, in some cases, an indicator ("codeword") may be used to provide a signal to a detector/decoder that the magnitude of change is not encoded into a "default" reduced number of bits.

FIG. 2 illustrates that the first sample 160 may be encoded into a "full" number bits (to be used as a reference value). FIG. 2 further illustrates that, for subsequent samples, a subtraction operation 202 may be performed to determine a magnitude of change (a delta), and an output determination operation 204 may be performed to determine a reduced number of bits to be used for encoding the change. Optionally, an indicator to be provided in the event that the change is not encoded into a "default" reduced number of bits. The subtraction operation 202 and the output determination operation 204 may be performed for N samples. After N samples, a next sample (illustrated as "Sample(N+1)" in FIG. 2) may be provided at the full-bit rate (for storage as a "new" reference value).

As an example, the second sample 162 may be subtracted from the first sample 160 to determine a first change 210 (illustrated as "Delta(1)" in FIG. 2). FIG. 2 illustrates that the first change 210 may be compared to various thresholds in order to determine the first output 164. In the event that the first change 210 does not satisfy a threshold, the first change 210 may be encoded into a default reduced number of bits (e.g., 4 bits) and provided as the first output 164 (without an indicator). In the event that the first change 210 satisfies a first threshold, the first change 210 may be encoded into a first "non-default" reduced number of bits (e.g., 8 bits). In this case, the first output 164 may include a first codeword (a 4-bit value that is reserved for use as an indicator of a transition from 4-bit values to 8-bit values). In the event that a subsequent change (e.g., the Nth change 212) does not satisfy the first threshold when using the non-default encoding scheme, the subsequent output (e.g., the Nth output 170) may include a second codeword (e.g., an 8-bit value that is reserved for use as an indicator of a transition from 8-bit values to 4-bit values). Alternatively, as described further herein, the 8-bit value may signal the transition while simultaneously providing the delta value (e.g., with the four leading zeros serving as the transition indication, and the four least significant bits representing the delta value). In the event that the subsequent change (e.g., the Nth change 212) satisfies the second threshold, the subsequent change (e.g., the Nth change 212) may be encoded into a second "non-default" reduced number of bits (e.g., 10 bits). In this case, the subsequent output (e.g., the Nth output 170) may include a third codeword (an 8-bit value that is reserved for use as an indicator of a transition from 8-bit values to 10-bit values). In alternative embodiments, more than three codewords or less than three codewords may be reserved for use as indicator(s) of a particular reduced number of bits that is different from the "default" reduced number of bits. As an example, when a "default" reduced number of bits is 6 bits, a fourth codeword may be reserved for use as an indicator of another "non-default" reduced number of bits (e.g., 8 bits in this example). As another example, when a "default" reduced number of bits is 10 bits (e.g., in the case of a high-frequency sensor, such as a pressure sensor), a single codeword may be reserved as an indicator of a single "non-default" reduced number of bits (e.g., 11 bits in this example).

As another example, the sample 168 (illustrated as "Sample(N)" in FIG. 2) may be subtracted from the first sample 160 to determine a change 212 (illustrated as "Delta(N)" in FIG. 2). FIG. 2 illustrates that the change 212 may be compared to various thresholds in order to determine the output 170. In the event that the change 212 does not satisfy the first threshold, the change 212 may be encoded into a default reduced number of bits (e.g., 4 bits) and provided as the output 170 (without an indicator). In the event that the change 212 satisfies the first threshold, the change 212 may be encoded into the first "non-default" reduced number of bits (e.g., 8 bits). In this case, the output 170 may include the codeword associated with a transition from 4-bit values to 8-bit values. In the event that the change 212 satisfies the second threshold, the change 212 may be encoded into the second "non-default" reduced number of bits (e.g., 10 bits). In this case, the output 170 may include the codeword associated with a transition from 8-bit values to 10-bit values. While not shown in FIG. 2, another 4-bit value may be reserved as an indicator of a transition from a default 4-bit encoding scheme to a non-default 10-bit encoding scheme. Alternatively, the transition may be signaled by sending the first indicator of the transition from the 4-bit encoding scheme to the 8-bit encoding scheme, followed by the second indicator of the transition from the 8-bit encoding scheme to the 10-bit encoding scheme.

Thus, FIG. 2 illustrates that data may be adaptively encoded into a reduced number of bits in order to reduce an amount of data that is stored/transmitted. Comparing a measured value to the reference value rather than comparing "delta" values may reduce drift due to errors in each "delta" value. Further, data that is stored/transmitted may be reduced in cases where the delta values fall within a "default" range, while codewords may allow values outside of this range to be stored/transmitted when appropriate.

Figure 3:
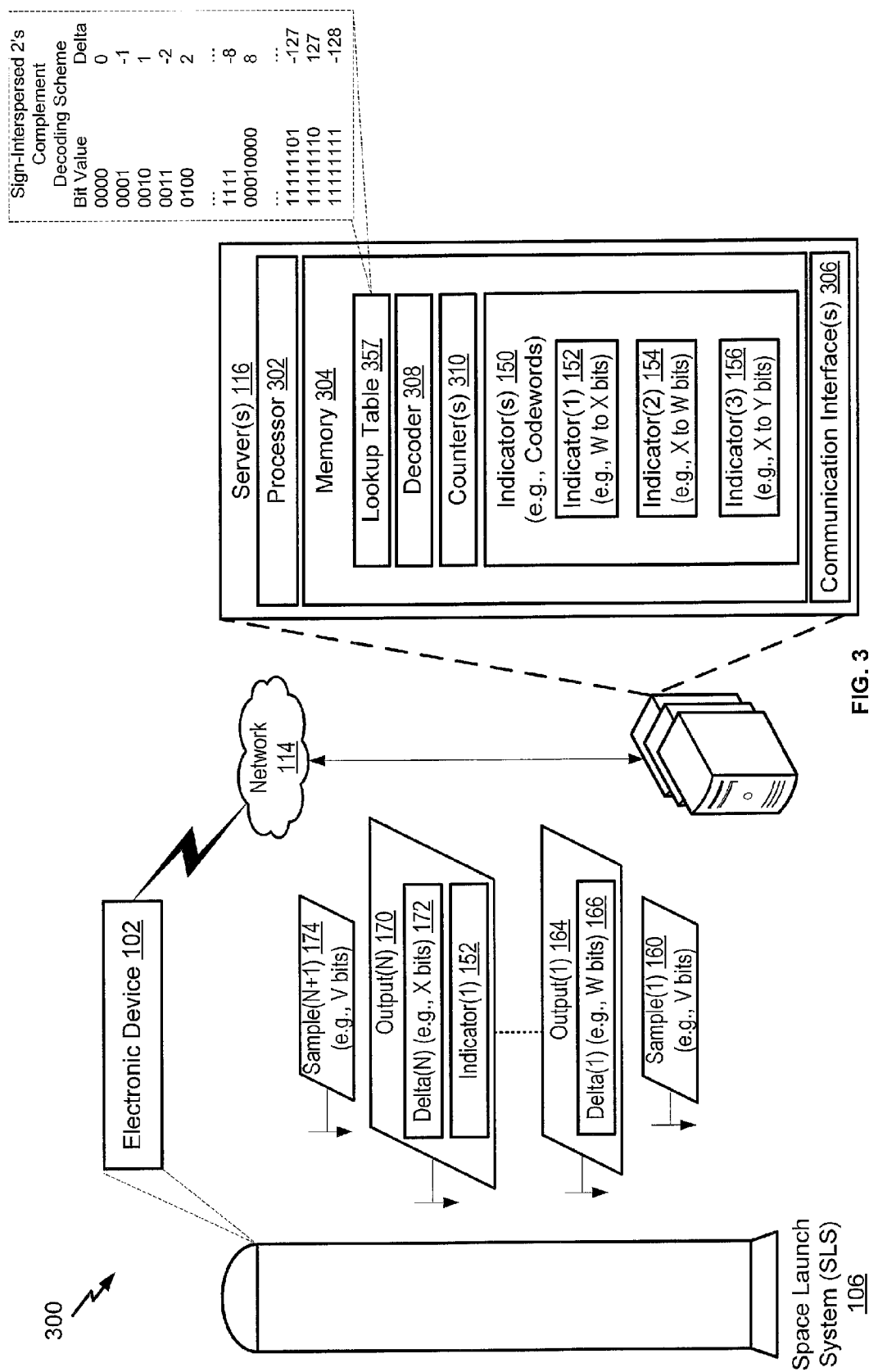
FIG. 3 is a block diagram of a particular embodiment of a system for decoding adaptively encoded data.

FIG. 3 is a block diagram 300 of a particular embodiment of a system for decoding adaptively encoded data. FIG. 3 illustrates that a detector/decoder may identify an indicator of an "unexpected" (or "non-default") reduced number of bits and determine the number of bits to be decoded based on the indicator.

In the embodiment illustrated in FIG. 3, the electronic device 102 is configured to receive data from one or more sensors of the space launch system 106. In the example of FIG. 3, the electronic device 102 is configured to communicate via the network 114 (or multiple networks) to the server 116 (or multiple servers). For example, the server 116 may be a terrestrial system configured to communicate with the space launch system 106 (e.g., before, during, or after launch). The server 116 includes a processor 302, a memory 304, and a communication interface 306 (or multiple communication interfaces). In the example of FIG. 3, a decoder 308, a counter 310 (or multiple counters), and the one or more indicators 150 are stored in the memory 304.

FIG. 3 further illustrates that a lookup table 357 associated with a sign-interspersed two's complement encoding scheme may be stored in the memory 304. Alternatively, the server 116 may be configured to calculate one or more values of the lookup table 357 based on an algorithm corresponding to the sign-interspersed two's complement decoding scheme of the present disclosure (e.g., using hardware, software, or a combination thereof). The lookup table 357 may be used to map a bit value that is encoded according to the sign-interspersed two's complement encoding scheme of the present disclosure into a corresponding delta value. The lookup table 357 includes a first plurality of bit values having the second number of bits (4 bits in this case) and a second plurality of bit values having a third number of bits (8 bits in this case). For ease of illustration, the lookup table 357 of FIG. 3 depicts a subset of possible bit values and a subset of associated delta values, it will be appreciated that the lookup table 357 also includes other possible bit values and associated delta values. To illustrate, other delta values that may be encoded in the "default" reduced number of bits (4 bits) include −3 (0101); 3 (0110); −4 (0111); 4 (1000); −5 (1001); 5 (1010); −6 (1011); 6 (1100); −7 (1101); and 7 (1110). Similarly, the lookup table 357 also includes other delta values (in ranges of −8 to −127 and +8 to +126, with −8 reserved as a transition indicator) that may be encoded in the first "non-default" number of bits (8 bits). As described further herein with respect to FIG. 1, the sign-interspersed two's complement encoding scheme may be used to encode common delta values (e.g., having a value in a range of −7 to +7) as 4-bit binary values. The decoder 308 may use a corresponding sign-interspersed two's complement decoding scheme to determine a delta value that is associated with the 4-bit binary value (as shown in the lookup table 157 of FIG. 1). Similarly, as further described herein with respect to FIG. 1, the sign-interspersed two's complement encoding scheme may be used to encode less common delta values (e.g., having a value in a range of −9 to −126 or in a range of +8 to +127, with −8, −128, and 127 reserved as transition indicators, and with −127 reserved for the case of a −8 delta value) as 8-bit binary values. The decoder 308 may use a corresponding sign-interspersed two's complement decoding scheme to determine a delta value that is associated with the 8-bit binary value (as shown in the lookup table 157 of FIG. 1).

As an illustrative, non-limiting example, when the decoder 308 receives a 0-bit binary value such as 0001, the decoder 308 may utilize the lookup table 357 to determine that the 4-bit binary value of 0001 corresponds to a delta value of −1. As another illustrative example, when the decoder 308 receives the 4-bit binary value of 1111, the decoder 308 may utilize the lookup table 357 to determine that the 4-bit binary value of 1111 represents an indicator that a next value to be decoded is an 8-bit binary value. As another example, when the decoder 308 receives an 8-bit binary value such as 00010000, the decoder 308 may utilize the lookup table 357 to determine that the 8-bit binary value of 00010000 corresponds to a delta value of +8. As a further example, if the decoder 308 receives the 8-bit binary value 00001111, the decoder 308 may determine that the 8-bit binary value corresponds to the 4-bit binary value 1111 without the four most significant bits omitted. As such, the 8-bit binary value of 00001111 may signal a transition from the non-default 8-bit encoding scheme to the default 4-bit encoding scheme. The decoder 308 may then utilize the lookup table 357 to determine a delta value corresponding to a 4-bit binary value that is received after the 8-bit binary value of 00001111. Alternatively, as described further herein, if the decoder 308 receives another 8-bit binary value with four leading zeros (e.g., 00000100), the decoder 308 may determine that the four leading zeros serve as the transition indicator and may utilize the lookup table 357 to determine that that the four least significant bits (e.g., 0100) corresponds to a delta value of +2. As yet another example, when the decoder 308 receives the 8-bit binary value of 11111110, the decoder 308 may utilize the lookup table 357 to determine that the 8-bit binary value of 11111110 represents an indicator that a next value to be decoded is a 10-bit binary value. One or more 10-bit binary values may be reserved to signal a transition from the non-default 10-bit encoding scheme to the non-default 8-bit encoding scheme or to the default 4-bit encoding scheme.

The server 116 may receive the first sample 160, and the decoder 308 may determine based on the counter 310 that the first sample 160 represents a "full" set of bits (e.g., V bits) to be decoded. The decoder 308 may decode the "full" set of bits to determine a value associated with the first sample 160. The server 116 may receive the first output 164, and the decoder 308 may determine based on the counter 310 that the first output 164 is not to be used as a reference value. When the decoder 308 determines that the first output 164 is not to be used as a reference value, the decoder 308 may determine whether the first output 164 is associated with one of the indicator(s) 150 stored in the memory 304. When the first output 164 is not associated with one of the indicator(s) 150, the decoder 308 may decode the first output 164 based on the "default" reduced number of bits to determine the change 166 (and optionally "re-create" the value based on the first sample 160 and the change 166).

The server 116 may receive the output 170. The output 170 includes a set of bits (e.g., the first indicator 152) having the "default" reduced number of bits. The decoder 308 may decode the set of bits and determine that the set of bits corresponds to the first indicator 152 (stored in the memory 304 of the server 116). The decoder 308 may determine (based on the first indicator 152) that a second number of bits (e.g., 8 bits, representing a "non-default" reduced number of bits) are to be decoded. The server 116 may receive the change 172 (e.g., a set of bits having a different number of bits than the "default" reduced number of bits). The decoder 308 may decode the set of bits (e.g., 8 bits in this example) to determine the magnitude of the change 172.

Thus, FIG. 3 illustrates that a detector/decoder may determine that a "non-default" reduced number of bits (e.g., 8 bits) is to be decoded based on an indicator (encoded in the "default" reduced number of bits, such as 4 bits) that is assigned to a particular "non-default" reduced number of bits. After decoding the "default" reduced number of bits (e.g., the indicator encoded into 4 bits), the decoder may decode a next set of bits (e.g., 8 bits) to determine a magnitude of change between values.

Figure 4:
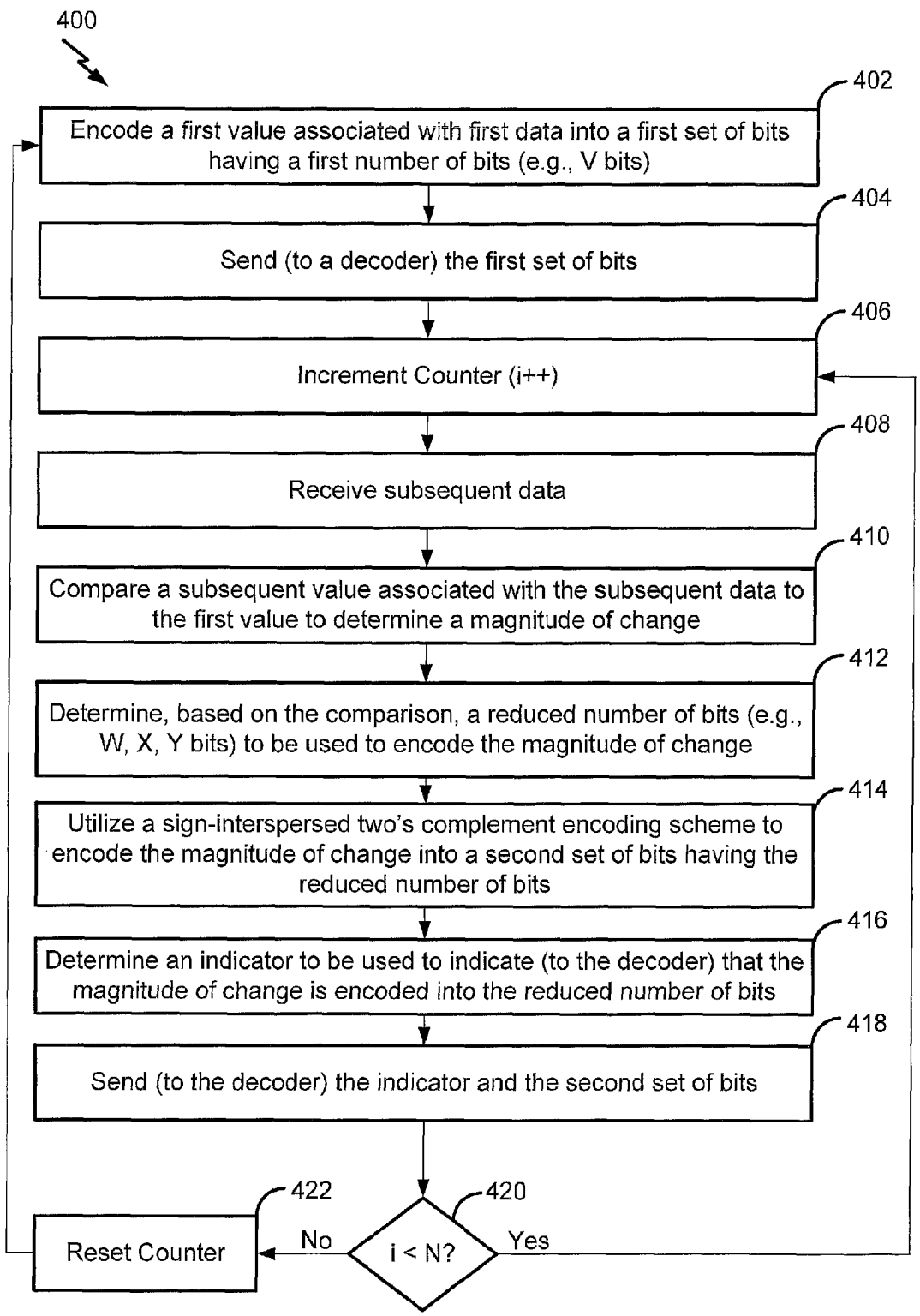
FIG. 4 is a flowchart depicting a particular embodiment of a method of adaptive encoding of data.

FIG. 4 is a flowchart depicting an exemplary embodiment of a method 400 of adaptively encoding data. In the particular embodiment illustrated in FIG. 4, a first value may be encoded into a first number of bits and may be sent to memory for storage as a reference value (and optionally to a decoder, such as a ground-based server). A second value may be encoded into a second number of bits that is different from the first number of bits. Based on a magnitude of change between the reference value (e.g., the first value) and the second value, an indicator (e.g., a "codeword") may be used to identify (to a detector/decoder) that the magnitude of change is encoded into a "non-default" reduced number of bits (e.g., the second number of bits). For example, a decoder may expect the second value to be encoded into a particular "default" reduced number of bits (e.g., 4 bits), and the indicator may provide a signal to the decoder that the second number of bits is a "non-default" reduced number of bits (e.g., 8 or 10 bits).

The method 400 may include encoding a first value associated with first data (e.g., sensor data) into a first set of bits (having a first number of bits), at 402. For example, referring to FIG. 1, the encoder 126 may encode a first value associated with the first sample 160 into a first set of bits having a first number of bits (e.g., V bits) and store the first value as the reference value 158 in the memory 122. The method 400 may also include sending (to a decoder) the first set of bits, at 404. For example, referring to FIG. 1, the encoder 126 may send the first sample 160 to the server(s) 116 via the network 114.

In the particular embodiment illustrated in FIG. 4, the method 400 includes incrementing a counter, at 406. For example, referring to FIG. 1, the comparator 130 may increment the counter 128 stored in the memory 122 (e.g., after storing the reference value 158 in the memory 122). The method 400 includes receiving subsequent data, at 408. For example, referring to FIG. 1, the sample 168 may be received from the first sensor 108.

The method 400 includes comparing a subsequent value associated with the subsequent data to the first value to determine a magnitude of change (between the first value and the subsequent value), at 410. For example, referring to FIG. 1, the comparator 130 may compare the sample 168 to the reference value 158 (that is associated with the first sample 160 and that is stored in the memory 122) in order to determine the magnitude of change.

The method 400 includes determining, based on the comparison, a reduced number of bits to be used to encode the magnitude of change, at 412. For example, referring to FIG. 1, the comparator 130 may determine a "non-default" reduced number of bits (e.g., X bits) to be used to encode the magnitude of change. In other cases, the comparator 130 may determine that the magnitude of change corresponds to a value that can be represented, based on the encoding scheme, using a "default" reduced number of bits (e.g., W bits).

The method 400 includes encoding the magnitude of change (between the subsequent value and the first value) into a second set of bits having the reduced number of bits, at 414. For example, referring to FIG. 1, the encoder 126 may encode the magnitude of change into the second set of bits (e.g., X bits, such as 8 bits). In other cases, the encoder 126 may encode the magnitude of change into the "default" reduced number of bits (e.g., W bits).

In the particular embodiment illustrated in FIG. 4, the method 400 includes determining an indicator to be used to indicate (to the decoder) that the magnitude of change is encoded into the reduced number of bits, at 416. For example, referring to FIG. 1, the first indicator 152 may represent a "codeword" that is stored in the memory 122 to be used to indicate that the magnitude of change is encoded into a particular "non-default" reduced number of bits (e.g., X bits, such as 8 bits). In other cases, no indicator may be used in the event that the magnitude of change is encoded into the "default" reduced number of bits (e.g., W bits, such as 4 bits).

The method 400 may also include sending (to the decoder) the indicator if needed (e.g., for a "non-default" reduced number of bits) and the second set of bits, at 418. For example, referring to FIG. 1, the electronic device 102 (e.g., onboard the space launch system 106) may send the output 170 to the server 116. The output 170 includes the first indicator 152 and the change 172 (that is encoded into X bits).

In the particular embodiment illustrated in FIG. 4, the method 400 further includes determining whether the counter satisfies a threshold, at 420. The threshold may correspond to a number of sets of bits (having a reduced number of bits) that have been encoded and sent, or the threshold may correspond to a number of samples received after storing the reference value 158. For example, referring to FIG. 1, the comparator 130 may determine based on the counter 128 that the sample 174 represents a next value to be stored in the memory 122 as a "new" reference value for comparison to subsequent values.

In response to determining that the threshold has not been satisfied, the method 400 may return to 406, where the counter may be incremented. In response to determining that the threshold has been satisfied, the method 400 includes resetting the counter, at 422. For example, referring to FIG. 1, the counter 128 may be reset after the reference value 158 has been stored in the memory 122. After resetting the counter, the method 400 may return to 402, where another value (associated with subsequent data) may be encoded into another set of bits (having the first number of bits).

Figure 5:
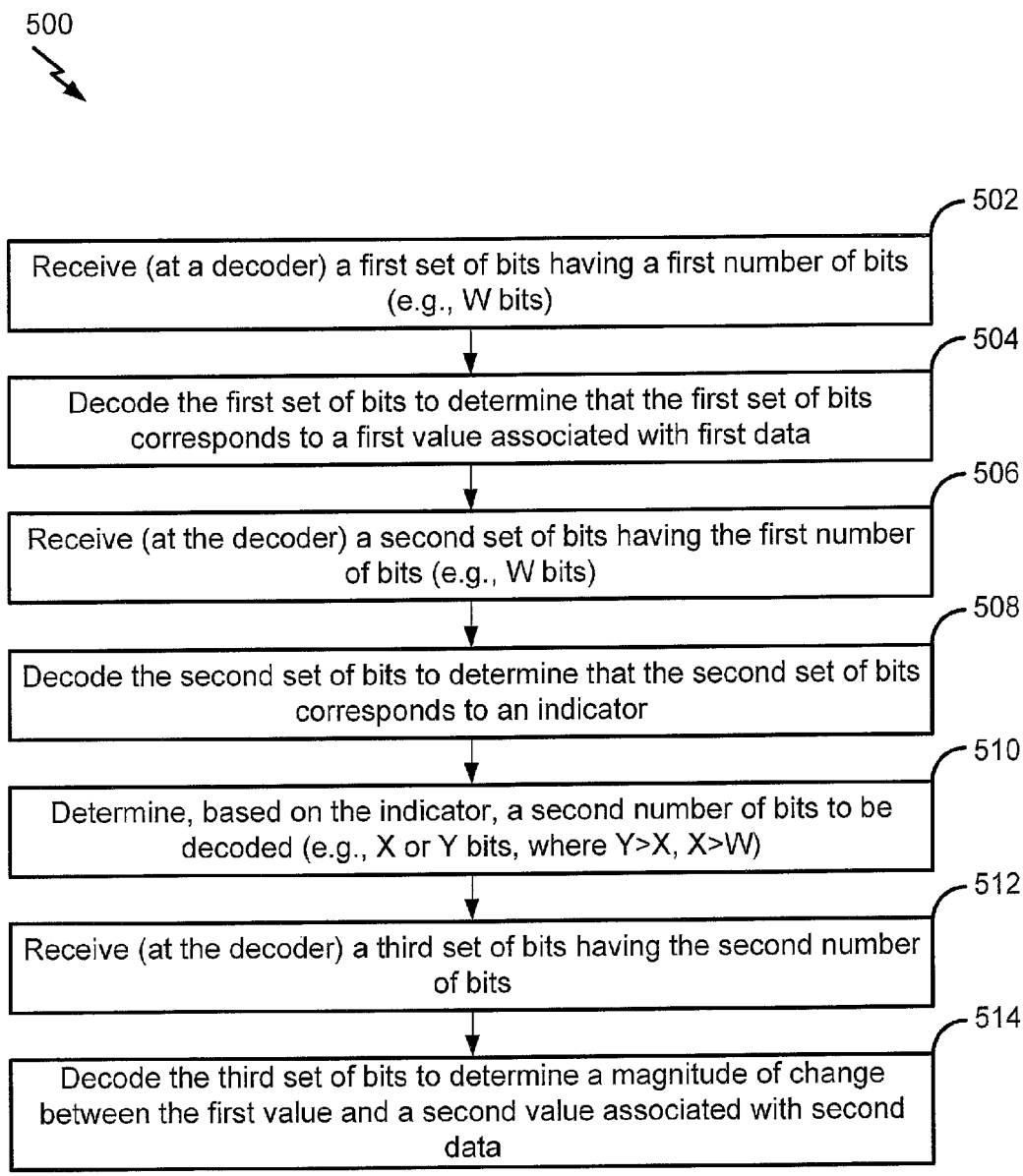
FIG. 5 is a flowchart depicting a particular embodiment of a method of decoding adaptively encoded data.

FIG. 5 is a flowchart depicting an exemplary embodiment of a method 500 of decoding adaptively encoded data. In the example of FIG. 5, a decoder may receive a first value that is encoded into a first number of bits (e.g., a "default" reduced number of bits, such as W bits), and the first value may be determined by decoding the first number of bits. FIG. 5 further illustrates that the decoder may receive an indicator (e.g., a codeword that is encoded into the "default" reduced number of bits) that provides a signal that a subsequent value is encoded into a "non-default" reduced number of bits (e.g., 8 or 10 bits). The subsequent value may be determined by decoding the "non-default" reduced number of subsequent bits (e.g., 8 or 10 bits following the indicator).

In the example of FIG. 5, the method 500 includes receiving (at a decoder) a first set of bits having a first number of bits, at 502. For example, referring to FIG. 3, the decoder 308 (at the server 116) may receive the first indicator 152 from the electronic device 102. The first indicator 152 may be encoded into a first number of bits (e.g., 4 bits, representing a "default" reduced number of bits to be decoded).

The method 500 also includes decoding the first set of bits to determine a first value (e.g., a value associated with first sensor data), at 504. For example, referring to FIG. 3, the decoder 308 may decode the output 164 (e.g., encoded into the "default" reduced number of bits, W bits) to determine the change 166.

The method 500 includes receiving (at the decoder) a second set of bits having the first number of bits, at 506. The method 500 includes decoding the second set of bits and determining that the second set of bits corresponds to an indicator, at 508. For example, referring to FIG. 3, the decoder 308 may decode the first number of bits (e.g., the first 4 bits of the output 170, representing the "default" reduced number of bits to be decoded) and may identify the first indicator 152 based on information stored in the memory 304 of the server 116.

The method 500 includes determining, based on the indicator, a second number of bits to be decoded, at 510. The second number of bits is different from the first number of bits. For example, referring to FIG. 3, the decoder 308 may determine, based on the first indicator 152, that a particular "non-default" reduced number of bits are to be decoded (e.g., a next X or Y bits, such as 8 or 10 bits).

The method 500 includes receiving (at the decoder) a third set of bits having the second number of bits, at 512. For example, referring to FIG. 3, the decoder 308 may receive the delta 172 (e.g., a next 8 bits of the output 170). The method 500 further includes decoding the third set of bits to determine a magnitude of change between the first value (the reference value) and a second value (e.g., associated with second sensor data), at 514. For example, referring to FIG. 3, the decoder 308 may decode the delta 172 to determine a magnitude of change from the first sample 160. In some embodiments, responsive to receiving the first indicator 152, the decoder 308 may continue to decode the particular "non-default" reduced number of bits until the decoder 308 receives a different indicator. To illustrate, an 8-bit value may be reserved as an indicator to provide a signal to the decoder 308 to return to decoding the "default" reduced number of bits (e.g., 4 bits). As another example, one or more 10-bit values may be reserved as indicator(s) to provide signal(s) to the decoder 308 to return to decoding the "default" reduced number of bits (e.g., 4 bits) or to decode a different "non-default" reduced number of bits (e.g., 8 bits).

Figure 6:
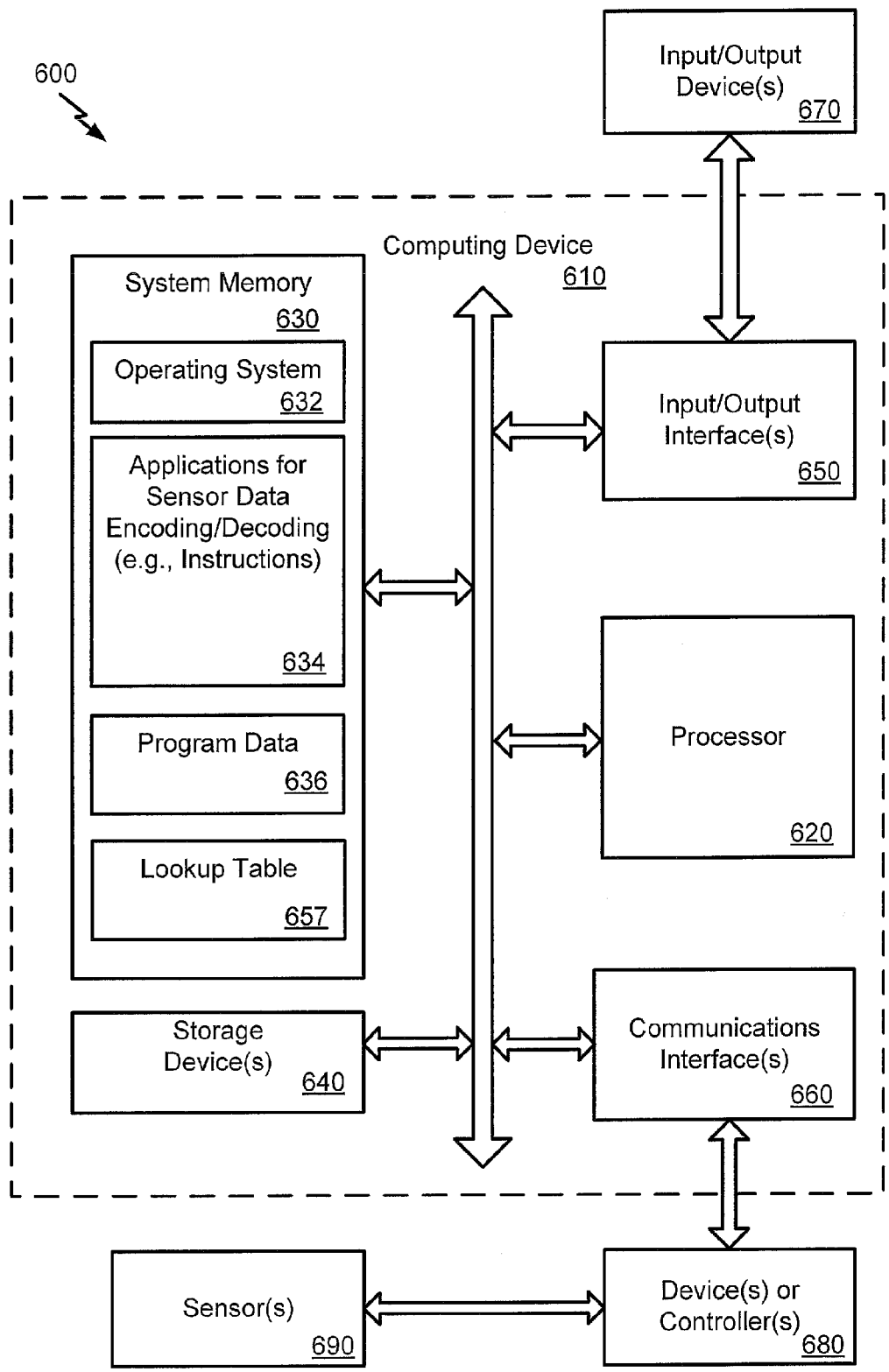
FIG. 6 is an illustration of a block diagram of a computing environment including a general purpose computing device configured to support embodiments of computer-implemented methods and computer-executable program instructions (or code) according to the present disclosure.

FIG. 6 is an illustration of a block diagram of a computing environment 600 including a general purpose computing device 610 configured to support embodiments of computer-implemented methods and computer-executable program instructions (or code) according to the present disclosure. For example, the computing device 610, or portions thereof, may execute instructions to adaptively encode/decode data in a particular number of bits. The computing device 610, or portions thereof, may further execute instructions according to any of the methods described herein.

The computing device 610 may include a processor 620. The processor 620 may communicate with the system memory 630, one or more storage devices 640, one or more input/output interfaces 650, one or more communications interfaces 660, or a combination thereof. The system memory 630 may include volatile memory devices (e.g., random access memory (RAM) devices), nonvolatile memory devices (e.g., read-only memory (ROM) devices, programmable read-only memory, and flash memory), or both. The system memory 630 may include an operating system 632, which may include a basic/input output system for booting the computing device 610 as well as a full operating system to enable the computing device 610 to interact with users, other programs, and other devices. The system memory 630 may include one or more applications 634 which may be executable by the processor 620. For example, the one or more applications 634 may include instructions executable by the processor 620 to adaptively encode/decode data in a particular number of bits. The system memory 630 may include program data 636 usable for controlling the adaptive encoding/decoding of data. The system memory 630 may also include a lookup table 657. In cases where the computing device 610 corresponds to the electronic device 102 of FIG. 1, the lookup table 657 may correspond to the lookup table 157 for use with the sign-interspersed two's complement encoding scheme, as described further herein with respect to FIG. 1. In cases where the computing device 610 corresponds to the server 116 of FIG. 3, the lookup table 657 may correspond to the lookup table 357 for use with the sign-interspersed two's complement decoding scheme, as described further herein with respect to FIG. 3.

The processor 620 may also communicate with one or more storage devices 640. For example, the one or more storage devices 640 may include nonvolatile storage devices, such as magnetic disks, optical disks, or flash memory devices. The storage devices 640 may include both removable and non-removable memory devices. The storage devices 640 may be configured to store an operating system, images of operating systems, applications, and program data. In a particular embodiment, the memory 630, the storage devices 640, or both, include tangible computer-readable media.

The processor 620 may also communicate with one or more input/output interfaces 650 that enable the computing device 610 to communicate with one or more input/output devices 670 to facilitate user interaction. The input/output interfaces 650 may include serial interfaces (e.g., universal serial bus (USB) interfaces or Institute of Electrical and Electronics Engineers (IEEE) 1394 interfaces), parallel interfaces, display adapters, audio adapters, and other interfaces. The input/output devices 670 may include keyboards, pointing devices, displays, speakers, microphones, touch screens, and other devices. The processor 620 may detect interaction events based on user input received via the input/output interfaces 1150. Additionally, the processor 620 may send a display to a display device via the input/output interfaces 650.

The processor 620 may communicate with devices or controllers 680 via the one or more communications interfaces 660. The one or more communications interfaces 660 may include wired Ethernet interfaces, IEEE 802 wireless interfaces, other wireless communication interfaces, or other network interfaces. The devices or controllers 680 may include host computers, servers, workstations, and other computing devices. FIG. 6 further illustrates that the devices or controllers 680 may be communicatively coupled to one or more sensors 690 (e.g., temperature sensors, pressure sensors, etc.). For example, the one or more sensors 690 may correspond to the sensor(s) 104 of FIG. 1.

Embodiments described above are illustrative and do not limit the disclosure. It is to be understood that numerous modifications and variations are possible in accordance with the principles of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A non-transitory computer-readable storage medium comprising instructions that, when executed by a processor, cause the processor to perform encoding operations comprising:
   determining a magnitude of change between a first value associated with first data and a second value associated with second data based on a comparison of the first value and the second value, wherein the first value is encoded into a first set of bits having a first number of bits; and
   encoding the magnitude of change into a second set of bits utilizing a sign-interspersed two's complement encoding scheme, the second set of bits having a second number of bits that is less than the first number of bits.

2. The non-transitory computer-readable storage medium of claim 1, wherein utilizing the sign-interspersed two's complement encoding scheme includes:
   encoding a first positive magnitude of change as a first two's complement value;
   encoding a second positive magnitude of change as a second two's complement value;
   encoding a first negative magnitude of change as a third two's complement value; and
   encoding a second negative magnitude of change as a fourth two's complement value,
   wherein, when ordered from a smallest two's complement value to a largest two's complement value, the first two's complement value is between the third two's complement value and the fourth two's complement value, and the fourth two's complement value is between the first two's complement value and the second two's complement value.

3. The non-transitory computer-readable storage medium of claim 1, wherein utilizing the sign-interspersed two's complement encoding scheme includes accessing a lookup table, the lookup table including a first plurality of bit values having the second number of bits and a second plurality of bit values having a third number of bits, wherein a bit reduction from the third number of bits to the second number of bits is associated with omission of one or more most significant bits.

4. The non-transitory computer-readable storage medium of claim 3, wherein the third number of bits is eight bits, and wherein the second number of bits is four bits corresponding to omission of four most significant bits with respect to the third number of bits.

5. The non-transitory computer-readable storage medium of claim 1, wherein the operations further comprise generating an output that includes a first indicator and the second set of bits, the first indicator indicating that the magnitude of change is encoded into the second number of bits, wherein the first indicator includes a third set of bits having the second number of bits.

6. The non-transitory computer-readable storage medium of claim 5, wherein the operations further comprise:
   sending the first set of bits to a memory, to a remote device, or a combination thereof; and
   sending the second set of bits and the first indicator to the memory, to the remote device, or a combination thereof.

7. The non-transitory computer-readable storage medium method of claim 1, wherein the operations further comprise:
   receiving third data;
   determining a magnitude of change between the first value and a third value associated with the third data based on a comparison of the first value and the third value; and
   encoding the magnitude of change between the first value and the third value into a third set of bits utilizing the sign-interspersed two's complement encoding scheme, the third set of bits having a third number of bits that is greater than the second number of bits.

8. The non-transitory computer-readable storage medium of claim 7, wherein the operations further comprise generating an output that includes the third set of bits and a second indicator, the second indicator indicating that the magnitude of change between the first value and the third value is encoded into the third number of bits.

9. The non-transitory computer-readable storage medium of claim 8, wherein the second indicator includes a fourth set of bits having the third number of bits.

10. The non-transitory computer-readable storage medium of claim 1, wherein the operations further comprise:
    receiving third data;

determining, based on a counter, that a third value associated with the third data is to be encoded into a third set of bits, the third set of bits having the first number of bits;

encoding the third value into the third set of bits; and sending the third set of bits.

11. The non-transitory computer-readable storage medium of claim 10, wherein the counter indicates a number of values that have been encoded into sets of bits having a reduced number of bits with respect to the first number of bits.

12. The non-transitory computer-readable storage medium of claim 1, wherein the operations further comprise:

receiving third data;

determining, based on a counter that indicates a number of values that have been encoded into sets of bits having a reduced number of bits with respect to the first number of bits, that a magnitude of change between the first value and a third value associated with the third data is to be determined based on a comparison of the first value and the third value;

determining, based on the comparison of the first value and the third value, a particular number of bits to be used to encode the magnitude of change between the first value and the third value, wherein the particular number of bits is less than the first number of bits; and encoding the magnitude of change into a third set of bits utilizing the sign-interspersed two's complement encoding scheme, the third set of bits having the particular number of bits.

13. The non-transitory computer-readable storage medium of claim 12, wherein the particular number of bits is the second number of bits, wherein the operations further comprise sending the third set of bits and the first indicator.

14. The non-transitory computer-readable storage medium of claim 12, wherein the particular number of bits is different from the second number of bits, wherein the operations further comprise sending the third set of bits without sending the first indicator.

15. The non-transitory computer-readable storage medium of claim 12, wherein the particular number of bits is different from the second number of bits, wherein the operations further comprise sending the third set of bits and a second indicator, the second indicator indicating that the magnitude of change between the first value and the third value is encoded into the particular number of bits.

16. A non-transitory computer-readable storage medium comprising instructions that, when executed by a processor, cause the processor to perform decoding operations comprising:

receiving a first set of bits having a first number of bits;

utilizing a sign-interspersed two's complement decoding scheme to decode the first set of bits;

determining that the first set of bits corresponds to a first indicator, wherein the first indicator indicates that a second number of bits are to be decoded, and wherein the second number of bits is different from the first number of bits;

receiving a second set of bits having the second number of bits; and decoding the second set of bits to determine a magnitude of change between a first value associated with first data and a second value associated with second data.

17. The non-transitory computer-readable storage medium of claim 16, wherein the operations further comprise:

receiving a third set of bits having the first number of bits;

utilizing the sign-interspersed two's complement decoding scheme to decode the third set of bits;

determining that the third set of bits corresponds to a second indicator, wherein the second indicator indicates a third number of bits to be decoded, and wherein the third number of bits is different from the first number of bits and is different from the second number of bits;

receiving a fourth set of bits having the third number of bits; and utilizing the sign-interspersed two's complement decoding scheme to decode the fourth set of bits to determine a magnitude of change between the first value associated with first data and a third value associated with third data.

18. A system comprising:

a processor; and a memory communicatively coupled to the processor, the memory storing instructions that are executable by the processor to perform operations comprising:

determining a magnitude of change between a first value associated with first data and a second value associated with second data based on a comparison of the first value and the second value, wherein the first value is encoded into a first set of bits having a first number of bits; and encoding the magnitude of change into a second set of bits utilizing a sign-interspersed two's complement encoding scheme, the second set of bits having a second number of bits that is less than the first number of bits.

19. The system of claim 18, wherein the operations further comprise generating an output that includes the second set of bits and an indicator, the indicator indicating that the magnitude of change is encoded into the second number of bits.

20. The system of claim 19, wherein the first data and the second data are captured by a sensor of a space launch system, the operations further comprising sending the second set of bits and the indicator to a ground-based system via a wireless transmission.

* * * * *